(12) United States Patent
Chung

(10) Patent No.: US 10,297,207 B2
(45) Date of Patent: May 21, 2019

(54) PIXEL-LIGHTING REGION AND LIGHTING DEVICE CONTAINING THE SAME

(71) Applicant: BOE TECHNOLOGY GROUP CO., LTD., Beijing (CN)

(72) Inventor: Chiehhsing Chung, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 18 days.

(21) Appl. No.: 15/528,718

(22) PCT Filed: Oct. 17, 2016

(86) PCT No.: PCT/CN2016/102254
§ 371 (c)(1),
(2) Date: May 22, 2017

(87) PCT Pub. No.: WO2017/152625
PCT Pub. Date: Sep. 14, 2017

(65) Prior Publication Data
US 2018/0190210 A1 Jul. 5, 2018

(30) Foreign Application Priority Data
Mar. 11, 2016 (CN) .......................... 2016 1 0140810

(51) Int. Cl.
*H01L 23/528* (2006.01)
*G09G 3/34* (2006.01)
(Continued)

(52) U.S. Cl.
CPC ......... *G09G 3/3406* (2013.01); *G09G 3/3208* (2013.01); *H01L 23/528* (2013.01);
(Continued)

(58) Field of Classification Search
CPC .... G09G 3/3406; G09G 3/3208; H01L 51/56; H01L 51/5262; H01L 51/5203; H01L 23/528
See application file for complete search history.

(56) References Cited

U.S. PATENT DOCUMENTS

2002/0101172 A1 8/2002 Bu
2004/0066357 A1 4/2004 Kawasaki
(Continued)

FOREIGN PATENT DOCUMENTS

CN 1942816 A 4/2007
CN 103778889 A 5/2014
(Continued)

OTHER PUBLICATIONS

The World Intellectual Property Organization (WIPO) International Search Report and Written Opinion for PCT/CN2016/102254 dated Jan. 22, 2017 13 Pages.
(Continued)

*Primary Examiner* — Amit Chatly
(74) *Attorney, Agent, or Firm* — Westerman, Hattori, Daniels & Adrian, LLP

(57) ABSTRACT

The present invention provides a pixel-lighting region, including: a conductive line, a resistive strip, a first electrode, a second electrode, and a light-emitting structure. One end of the resistive strip is electrically coupled to the conductive line and another end of the resistive strip is electrically coupled to the first electrode; one side of the light-emitting structure is electrically coupled to the first electrode and another side of the light-emitting structure is electrically coupled to the second electrode; and a resistance of the resistive strip is adjustable in a fabrication process to achieve a brightness level of the pixel-lighting region.

18 Claims, 3 Drawing Sheets

(51) Int. Cl.
*G09G 3/3208* (2016.01)
*H01L 51/52* (2006.01)
*H01L 51/56* (2006.01)

(52) U.S. Cl.
CPC ...... *H01L 51/5203* (2013.01); *H01L 51/5262* (2013.01); *H01L 51/56* (2013.01)

(56) References Cited

U.S. PATENT DOCUMENTS

| | | | | |
|---|---|---|---|---|
| 2005/0104508 A1* | 5/2005 | Ozawa | ................ | H01L 27/3239 313/500 |
| 2006/0102904 A1* | 5/2006 | Lai | .................... | G02F 1/134336 257/72 |
| 2007/0195042 A1 | 8/2007 | Mos | | |
| 2014/0346448 A1* | 11/2014 | You | .................... | H01L 51/5228 257/40 |
| 2015/0154906 A1 | 6/2015 | Chung | | |
| 2016/0351649 A1 | 12/2016 | Li | | |

FOREIGN PATENT DOCUMENTS

| | | |
|---|---|---|
| CN | 104681595 A | 6/2015 |
| CN | 104882463 A | 9/2015 |
| CN | 204884490 U | 12/2015 |
| CN | 105552068 A | 5/2016 |
| CN | 205428919 U | 8/2016 |
| JP | 2012004419 A | 1/2012 |
| TW | 561445 B | 11/2003 |

OTHER PUBLICATIONS

State Intellectual Property Office of the P.R.C. (SIPO) Office Action 1 for 201610140810.6 dated Sep. 22, 2017 12 Pages (including translation).

* cited by examiner

PIXEL-LIGHTING REGION AND LIGHTING DEVICE CONTAINING THE SAME

CROSS-REFERENCE TO RELATED APPLICATION

This application is a national phase entry under 35 U.S.C. § 371 of PCT patent application No. PCT/CN2016/102254, filed on Oct. 17, 2016, which claims the priority of Chinese Patent Application No. 201610140810.6, filed Mar. 11, 2016, the entire contents of both of which are incorporated herein by reference.

TECHNICAL FIELD

The present invention relates to display technology, more particularly, to a pixel-lighting region and a lighting device containing the pixel-lighting region.

BACKGROUND

Organic light-emitting diode (OLED) display panels have been widely used in flat surface illumination applications such as certain design lamps and warning lights. The lighting films of flat surface illumination applications often have squared shapes, rectangular shapes, or circular shapes. Currently, to improve the yield of lighting surface used in such illumination applications, the illuminating region of a lighting surface is often divided into a plurality of small sub-regions. The dividing process is referred as a pixelating process. A pixelated lighting surface is less susceptible to short circuit issues and failure of the entire illuminating region caused by a single impurity.

After the lighting surface of the flat surface illumination applications is pixelated, dynamic voltage drop or voltage drop often occurs on the positive electrode and the negative electrode. The lighting of the lighting surface can be less uniformed. To improve the uniformity of the lighting, positive electrodes and negative electrodes are often alternatingly arranged in a circuit. For example, positive electrodes and negative electrodes may be arranged at the four corners of a lighting surface to reduce the impact of voltage drops. However, in such an arrangement, it may be more difficult to connect the positive electrodes and the negative electrodes to power supply.

SUMMARY

In one aspect, the present invention provides a pixel-lighting region, including: a conductive line, a resistive strip, a first electrode, a second electrode, and a light-emitting structure. One end of the resistive strip is electrically coupled to the conductive line and another end of the resistive strip is electrically coupled to the first electrode; one side of the light-emitting structure is electrically coupled to the first electrode and another side of the light-emitting structure is electrically coupled to the second electrode; and a resistance of the resistive strip is adjustable in a fabrication process to achieve a brightness level of the pixel-lighting region.

Optionally, the resistive strip having a low resistance enables the pixel-lighting region to emit light of a high brightness level.

Optionally, the resistance of the resistive strip is adjusted by varying a length, a width, or a material of the resistive strip.

Optionally, the pixel-lighting region further includes an extended conductive line, wherein the resistance of the resistive strip is adjusted by electrically connecting the resistive strip to the extended conductive line.

Another aspect of the present disclosure provides a lighting device, including: a substrate, a plurality of pixel-lighting regions in an array on the substrate, a conductive line between adjacent pixel-lighting regions, a pixel-lighting region comprising a resistive strip, a first electrode, a second electrode, and a light-emitting structure. One end of the resistive strip is electrically coupled to the conductive line and another end of the resistive strip is electrically coupled to the first electrode; one side of the light-emitting structure is electrically coupled to the first electrode and another side of the light-emitting structure is electrically coupled to the second electrode; and a resistance of the resistive strip is adjustable to achieve a brightness level of the pixel-lighting region.

Optionally, the resistive strip having a low resistance enables the pixel-lighting region to emit light of a high brightness level.

Optionally, the resistance of the resistive strip is adjusted by varying a length, a width, or a material of the resistive strip.

Optionally, the resistance of a resistive strip is adjusted by varying a shape of the resistive strip.

Optionally, the lighting device further includes an insulating layer between the substrate and the resistive strip, wherein at least one extended conductive line is on the substrate, an orthogonal projection of an extended conductive line on the substrate and an orthogonal projection of the resistive strip on the substrate having an overlapping area.

Optionally, one end of the extended conductive line is electrically coupled to the conductive line and another end of the extended conductive line is floating.

Optionally, both ends of the extended conductive line are electrically coupled to the conductive line.

Optionally, the extended conductive line and the conductive line are formed in a fabrication step.

Optionally, a resistance of the resistive strip is adjusted by being electrically connected to the at least one extended conductive line.

Optionally, the conductive line and the second electrode are separately electrically coupled to an external power supply.

Optionally, terminals of the conductive line and the second electrode for connecting to the external power supply are on one side of the lighting device.

Optionally, the light-emitting structure is made of one or more of organic light-emitting diodes, quantum dot light-emitting diodes, and micro light-emitting diodes.

Optionally, second electrodes of the plurality of pixel-lighting regions form a one-piece structure.

BRIEF DESCRIPTION OF THE FIGURES

The following drawings are merely examples for illustrative purposes according to various disclosed embodiments and are not intended to limit the scope of the present invention.

FIG. 2b illustrates a cross-sectional view of the pixel-lighting region shown in FIG. 2a;

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

It should be noted that, the figures are merely for illustrative purposes. The dimensions and shapes of the objects shown in the figures do not reflect the actual dimensions, shapes, and ratios of the objects.

The present disclosure provides a pixel-lighting region and a lighting device. The light device may include multiple pixel-lighting regions. Conductive lines may be disposed between pixel-lighting regions. In each pixel-lighting region, a resistive strip, a first electrode, a light-emitting structure, and a second electrode may be disposed. One end of the resistive strip may be electrically connected to or electrically coupled to the conductive line. The other end of the resistive strip may be electrically connected to or electrically coupled to the first electrode. One side of the light-emitting structure may be electrically connected to or electrically coupled to the first electrode. The other side of the light-emitting structure may be electrically connected to or electrically coupled to the second electrode. The conductive lines and the second electrodes may be electrically connected to the external power supply separately to prevent non-uniformity in the brightness level of the display device caused by voltage drop. Further, the terminals, of the conductive lines and the second electrodes, for connecting the external power supply, may be disposed on one side of the display device. This resolves the difficulty in connections between the external power supply and the conductive lines and between the external power supply and the second electrodes.

Further, certain pixel-lighting regions may correspond to a design or a pattern displayed by the lighting device. The resistances of the resistive strips in the pixel-lighting regions may be determined according to different applications and/or designs. By adjusting the resistances of the resistive strips, the voltages applied on the first electrodes may be controlled or adjusted. The brightness level of each pixel-lighting region may be controlled. The pattern display by the display device may be more stable.

Figure 1:
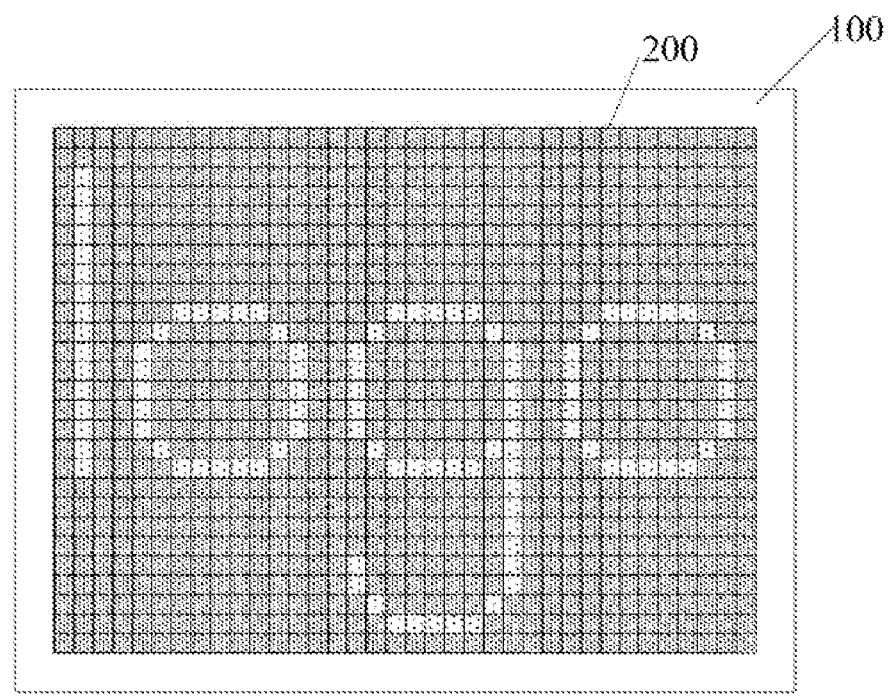
FIG. 1 illustrates an exemplary lighting device according to various disclosed embodiments of the present disclosure.
Figure 2A:
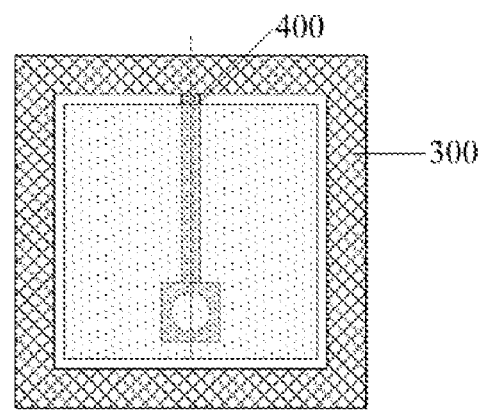
FIG. 2a illustrates an overview of a pixel-lighting region in a lighting device according to various disclosed embodiments of the present disclosure.
Figure 2B:
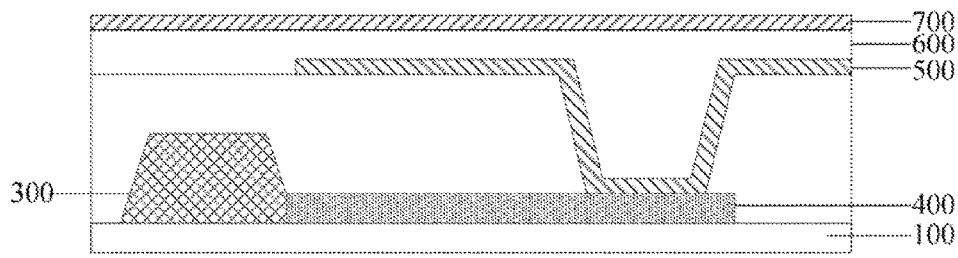

FIG. 1 illustrates an exemplary lighting device provided by the present disclosure. FIG. 2a illustrates an exemplary overview of a pixel-lighting region 200. FIG. 2b illustrates an exemplary cross-sectional view of the pixel-lighting region 200 along the dashed line in FIG. 2a. The lighting device may include a substrate 100 and a plurality of pixel-lighting regions 200. The pixel-lighting regions 200 may be arranged in an array. A pixel-lighting region 200 may be a pixel. As shown in FIGS. 2a and 2b, the lighting device may further include conductive lines 300 disposed between adjacent pixel-lighting regions 200. The conductive lines 300 may be disposed on the substrate 100. As shown in FIGS. 2a and 2b, each pixel-lighting region 200 may include a resistive strip 400, a first electrode 500, a light-emitting structure 600, and a second electrode 700. One end of the resistive strip 400 may be electrically coupled to the conductive line 300. The other end of the resistive strip 400 may be electrically coupled to the first electrode 500. One side of the light-emitting structure 600 may be coupled to the first electrode 500. The other side of the light-emitting structure 600 may be coupled to the second electrode 700.

The resistance of the resistive strip 400 in a pixel-lighting region 200 may be determined according to brightness level required for the pixel-lighting region 200. The resistance of the resistive strips 400 in different pixel-lighting regions 200 may be the same or may be different.

In some embodiments, the light-emitting structure 600 may include one or more of organic light-emitting diodes, quantum dot light-emitting diodes, micro light-emitting diodes, and other suitable light-emitting materials.

In the disclosed lighting device, the brightness level of the light-emitting structure 600 in a pixel-lighting region 200 may be coupled with or dependent on the voltages applied on the first electrode 500 and the second electrode 700. In some embodiments, the second electrodes 700 of the pixel-lighting regions 200 may be electrically coupled. That is, the second electrodes 700 of the pixel-lighting regions 200 in the disclosed lighting device may form a one-piece structure. The resistance of the resistive strip 400 in each pixel-lighting region 200 may be determined or adjusted according to a desired brightness level of the pixel-lighting region 200. By adjusting the resistance of a resistive strip 400, the voltage applied on the first electrode 500, electrically coupled to the resistive strip 400, may be controlled. The brightness level of the pixel-lighting region 200 may be controlled accordingly. The pattern displayed by the lighting device may be more stable. For example, resistive strips 400 of two different resistances may be applied in the lighting device shown in FIG. 1. A pattern of "logo" may be displayed by the disclosed lighting device.

In the disclosed lighting device, the conductive lines 300 and the second electrodes 700 may be electrically coupled to an external power supply separately. Non-uniformity caused by voltage drop in the lighting device may be prevented. In some embodiments, the terminals, of the conductive lines 300 and the second electrodes 700, used for connecting the external power supply, may be disposed on one side of the lighting device. Accordingly, the connections between the external power supply and the conductive lines 300, and between the external power supply and the second electrodes 700, may be easier to implement.

In some embodiments, for a pixel-lighting region 200, a resistive strip 400 with a lower resistance may result a higher brightness level. For example, as shown in FIG. 1, compared to the resistive strips 400 used in the pixel-lighting regions 200 for showing the background of "logo", the resistive strips 400 used in the pixel-lighting regions 200 for displaying the pattern "logo" may have a lower resistance. Thus, the brightness level of "logo" may be higher than the brightness level of the background. That is, the pattern "logo" may appear brighter than the background.

In some embodiments, when fabricating the disclosed lighting device, a desired pattern may be determined first. Further, resistive strips 400 of different resistances may be disposed in pixel-lighting regions 200 at different portions of the lighting device. Certain portions of the lighting device may appear to be brighter and certain portions may appear to be darker. The number of different resistances may be determined according to embodiments and the pattern to be displayed by the lighting device. The different brightness levels displayed by the lighting device may form the desired pattern. To adjust the resistances of the resistive strips 400, the resistive strips 400 may have at least one of feature or condition (a), feature (b), and feature (c).

Figure 3:
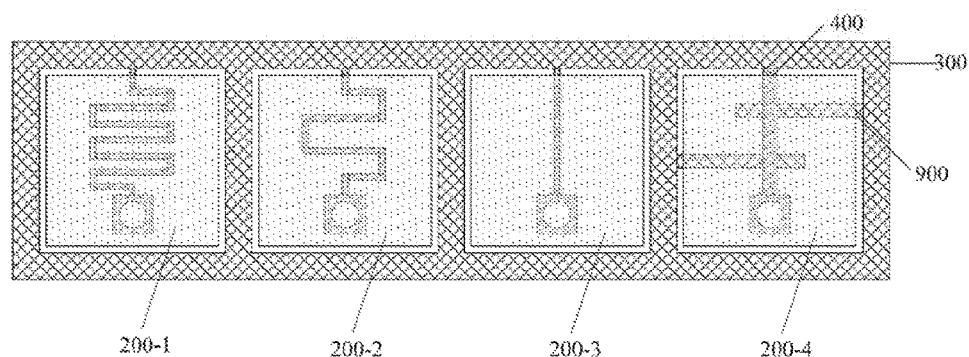
FIGS. 3 and 4 each illustrates an exemplary arrangement of resistive strips in a lighting device according to various disclosed embodiments of the present disclosure.

Feature (a) refers to different lengths. All other conditions and features being the same, a longer resistive strip 400 may have a higher resistance. For example, as shown in FIG. 3, the resistances of the resistive strips 400 in pixel-lighting regions 200-1, 200-2, and 200-3, may gradually decrease from pixel-lighting regions 200-1 to 200-3, and the brightness levels of the three pixel-lighting regions 200 may increase gradually from sub-regions 200-1 to 200-3.

Feature (b) refers to different widths. All other conditions and features being the same, a wider resistive strip 400 may have a lower resistance. For example, as shown in FIG. 3, the width of the resistive strip 400 in pixel-lighting region 200-3 may be narrower than the width of the resistive strip 400 in the pixel-lighting region 200-4. Thus, the resistance of the resistive strip 400 in the pixel-lighting region 200-4 may be lower. The brightness level of the pixel-lighting region 200-4 may be higher than the brightness level of the pixel-lighting region 200-3.

Feature (c) refers to different materials. All other conditions and features being the same, a resistive strip 400 with a higher resistivity may have a higher resistance. Materials with different resistivity may be used to fabricate the resistive strips 400 such that the resistive strips 400 may have different desired resistances.

Figure 4:
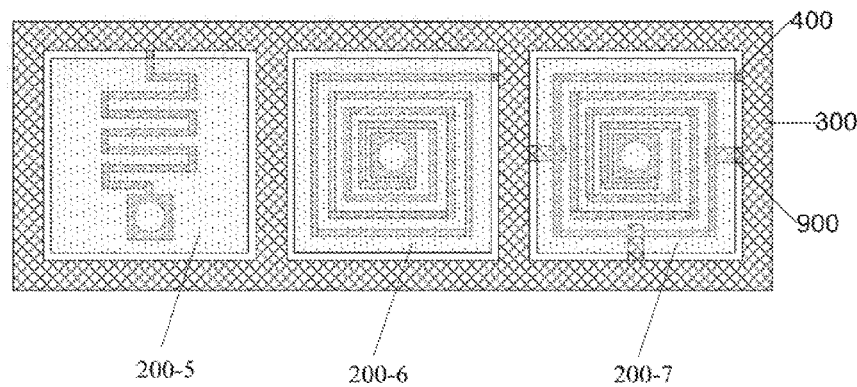

Further, in some embodiments, to form resistive strips 400 of different resistances, resistive strips 400 in different pixel-lighting regions 200 may have different shapes. As shown in FIG. 4, the resistive strips 400 in pixel-lighting regions 200-5 and 200-6 may have different shapes. For example, the resistive strip 400 in pixel-lighting region 200-5 may have a winding shape, and the resistive strips 400 in pixel-lighting regions 200-6 and 200-7 may each have a spiral shape.

In certain embodiments, the resistance of a resistive strip 400 may be determined or adjusted based on the distance between the resistive strip 400 and the external power supply. Thus, by adjusting the resistance of the resistive strip 400, the voltage applied on the corresponding firsts electrode 500 may be adjusted to a desired value so that voltage drop on the second electrode 700 may be compensated. Thus, the voltage applied between the first electrode 500 and the second electrode 700 may be adjusted to a desired value.

Figure 5A:
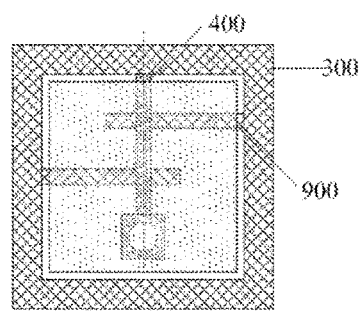
FIG. 5a illustrates an overview of another pixel-lighting region in a lighting device according to various disclosed embodiments of the present disclosure.
Figure 5B:
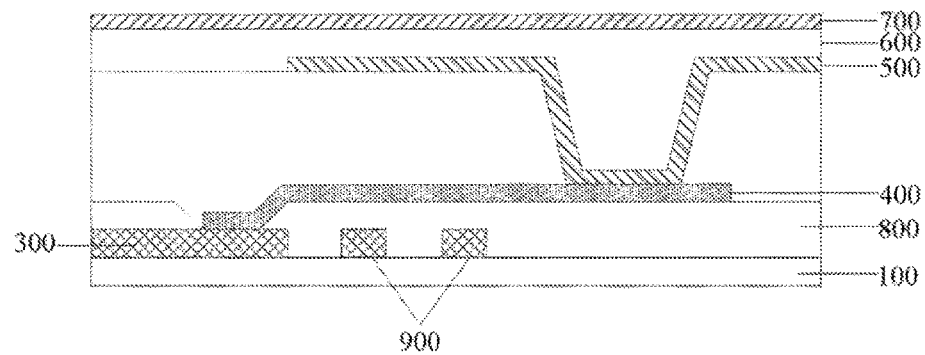
FIG. 5b illustrates a cross-sectional view of the pixel-lighting region shown in FIG. 5a along the dashed line.

In some embodiment, when fabricating the disclosed lighting device, if the pattern to be formed is not determined, an insulating layer may be formed. FIG. 5a illustrates an exemplary overview of a pixel-lighting region 200. FIG. 5b illustrates an exemplary cross-sectional view of the pixel-lighting region 200 along the dashed line in FIG. 5a. As shown in FIGS. 5a and 5b, an insulating layer 800 may be formed between the substrate 100 and a resistive strip 400. Extended conductive lines 900 may be formed in at least one pixel-lighting region 200 on the substrate 100. The orthogonal projection of the extended conductive lines 900 on the substrate 100 may overlap with the orthogonal projection of the resistive strip 400 on the substrate 100. The extended conductive lines 900 and the conductive line 300 may be formed in a same fabrication step. After the lighting device is formed, the brightness level of a pixel-lighting region 200 may be changed through the extended conductive lines 900. The extended conductive lines 900 may be configured to change the resistance of the resistive strip 400 of the same pixel-lighting region 200 by being electrically coupled to the resistive strip 400 through a suitable way. For example, laser soldering may be used to electrically connect an extended conductive line 900 with the corresponding resistive strip 400 at an overlapping area. Accordingly, the resistance of the resistive strip 400 may be changed and the brightness level of the pixel-lighting region 200 may be changed. In one embodiment, as shown in FIG. 1, during the fabrication process, the resistance of the resistive strip 400 of the pixel-lighting regions 200 forming the pattern "logo" may be soldered to electrically connect an extended conductive line 900 with the corresponding resistive strip 400 to have a lower resistance.

In some embodiments, as shown in FIG. 5a, one end of an extended conductive line 900 may be electrically coupled to the conductive lines 300, and the other end of the extended conductive line 900 may be floating. In some other embodiments, both ends of an extended conductive line 900 may be electrically coupled to the conductive lines 300. For illustrative purposes, as shown in FIG. 5a, one end of an extended conductive line 900 may be electrically coupled to the conductive lines 300, and the other end of the extended conductive line 900 may be floating.

In some embodiments, one pixel-lighting region 200 may contain one or more extended conductive lines 900. The number of extended conductive lines 900 may be determined according to different applications and/or designs.

Further, in some embodiments, in one pixel-lighting region 200, an extended conductive line 900 may have one or more overlapping areas with the resistive strip 400. The number of overlapping areas between an extended conductive line 900 and the resistive strip 400 may be determined according to different applications and/or designs.

In some embodiments, a first electrode 500 may be a positive electrode and a second electrode 700 may be a negative electrode. In some other embodiments, a first electrode 500 may be a negative electrode and a second electrode 700 may be a positive electrode.

The present disclosure provides a lighting device. Conductive lines may be disposed between pixel-lighting regions. In each pixel-lighting region, a resistive strip, a first electrode, a light-emitting structure, and a second electrode may be disposed. One end of the resistive strip may be electrically coupled to the conductive line. The other end of the resistive strip may be electrically coupled to the first electrode. One side of the light-emitting structure may be electrically coupled to the first electrode. The other side of the light-emitting structure may be electrically coupled to the second electrode. The conductive lines and the second electrodes may be electrically coupled to the external power supply separately to prevent non-uniformity in the brightness level of the display device caused by voltage drop. Further, the terminals, of the conductive lines and the second electrodes, for connecting the external power supply, may be disposed on one side of the display device. Such arrangements make easy and simple connections between the external power supply and the conductive lines and between the external power supply and the second electrode. Further, the resistances of the resistive strips in the pixel-lighting regions may be determined according to different applications and/or designs. By adjusting the resistances of the resistive strips, the voltages applied on the first electrodes may be controlled or adjusted. The brightness level of each pixel-lighting region may be controlled. The pattern display by the display device may be more stable.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A pixel-lighting region, comprising:
a conductive line,
a resistive strip,
a first electrode,
a second electrode, and
a light-emitting structure,
wherein one end of the resistive strip is electrically coupled to the conductive line and another end of the resistive strip is electrically coupled to the first electrode;
wherein one side of the light-emitting structure is electrically coupled to the first electrode and another side of the light-emitting structure is electrically coupled to the second electrode;
wherein the conductive line is arranged in a rectangular grid structure;
wherein the pixel-lighting region further comprises a plurality of extended conductive lines;
wherein at least two extension directions of at least two of the plurality of extended conductive lines intersect;
wherein the at least two of the plurality of extended conductive lines are in contact with different sides of the rectangular grid structure respectively, in plan view; and
wherein the at least two of the plurality of extended conductive lines do not overlap in plan view.

2. The pixel-lighting region according to claim 1, wherein the resistive strip having a low resistance enables the pixel-lighting region to emit light of a high brightness level.

3. The pixel-lighting region according to claim 1, wherein the resistance of the resistive strip is adjusted by varying a length, a width, or a material of the resistive strip.

4. A lighting device, comprising:
a substrate,
a plurality of pixel-lighting regions in an array on the substrate,
a conductive line between adjacent pixel-lighting regions,
a pixel-lighting region comprising a resistive strip,
a first electrode,
a second electrode, and
a light emitting structure, wherein one end of the resistive strip is electrically coupled to the conductive line and another end of the resistive strip is electrically coupled to the first electrode;
wherein one side of the light-emitting structure is electrically coupled to the first electrode and another side of the light-emitting structure is electrically coupled to the second electrode;
wherein the conductive line is arranged in a rectangular grid structure;
wherein the lighting device further comprises a plurality of extended conductive lines;
wherein at least two extension directions of at least two of the plurality of extended conductive lines intersect;
wherein the at least two of the plurality of extended conductive lines are in contact with different sides of the rectangular grid structure respectively; and
wherein the at least two of the plurality of extended conductive lines on the substrate do not overlap in plan view.

5. The lighting device according to claim 4, wherein the resistive strip having a low resistance enables the pixel-lighting region to emit light of a high brightness level.

6. The lighting device according to claim 4, wherein the resistance of the resistive strip is adjusted by varying a length, a width, or a material of the resistive strip.

7. The lighting device according to claim 4, wherein the resistance of a resistive strip is adjusted by varying a shape of the resistive strip.

8. The lighting device according to claim 4, wherein one end of the extended conductive line is electrically coupled to the conductive line and another end of the extended conductive line is floating.

9. The lighting device according to claim 4, wherein both ends of the extended conductive line are electrically coupled to the conductive line.

10. The lighting device according to claim 4, wherein the extended conductive line and the conductive line are formed in a fabrication step.

11. The lighting device according to claim 4, wherein a resistance of the resistive strip is adjusted by being electrically connected to the at least one extended conductive line.

12. The lighting device according to claim 4, wherein the conductive line and the second electrode are separately electrically coupled to an external power supply.

13. The lighting device according to claim 12, wherein terminals of the conductive line and the second electrode for connecting to the external power supply are on one side of the lighting device.

14. The lighting device according to claim 4, wherein the light-emitting structure is made of one or more of organic light-emitting diodes, quantum dot light-emitting diodes, and micro light-emitting diode.

15. The lighting device according to claim 4, wherein second electrodes of the plurality of pixel-lighting regions form a one-piece structure.

16. The lighting device according claim 4, wherein each pixel-lighting region of the plurality of pixel-lighting regions is within the rectangular grid structure, in plan view.

17. The lighting device according claim 16, wherein the resistive strip at least partially overlaps each of the at least two of the plurality of extended conductive lines, in plan view.

18. The lighting device according claim 17, wherein the resistive strip has a spiral shape.

* * * * *